United States Patent [19]

Yamazaki et al.

[11] Patent Number: 5,411,195
[45] Date of Patent: May 2, 1995

[54] BONDING APPARATUS

[75] Inventors: Nobuto Yamazaki; Ryuichi Kyomasu, both of Tokyo, Japan

[73] Assignee: Kabushiki Kaisha Shinkawa, Tokyo, Japan

[21] Appl. No.: 182,858

[22] Filed: Jan. 18, 1994

[30] Foreign Application Priority Data

Jan. 18, 1993 [JP] Japan .................................. 5-023324

[51] Int. Cl.6 .......................... B23K 1/06; B23K 20/10
[52] U.S. Cl. .......................................... 228/1.1; 228/8
[58] Field of Search .................... 228/1.1, 8; 156/580.1

[56] References Cited

U.S. PATENT DOCUMENTS

| | | | |
|---|---|---|---|
| 3,794,236 | 2/1974 | Salzer et al. | 228/8 |
| 4,040,885 | 8/1977 | Hight et al. | 228/1.1 |
| 5,263,630 | 11/1993 | Kanomata et al. | 228/1.1 |

Primary Examiner—Kuang Y. Lin
Assistant Examiner—Jeffrey T. Knapp
Attorney, Agent, or Firm—Koda and Androlia

[57] ABSTRACT

A bonding apparatus including an ultrasonic horn that has a bonding tool, a horn support, which is for mounting the ultrasonic horn to a bonding arm of the bonding apparatus, and vibration-generating sources provided on both sides of the horn support. These vibration-generating sources are operated to generate vibrations by an ultrasonic oscillation device that operates the vibration-generating sources via separate outputs.

8 Claims, 3 Drawing Sheets

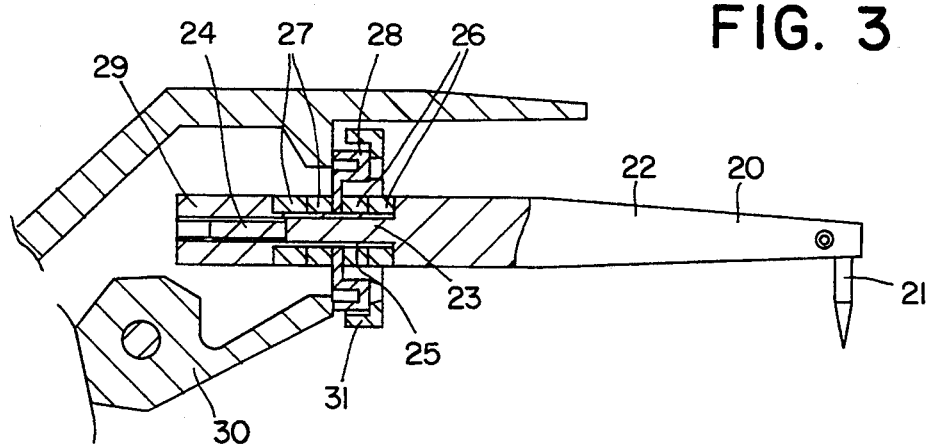
FIG. 3
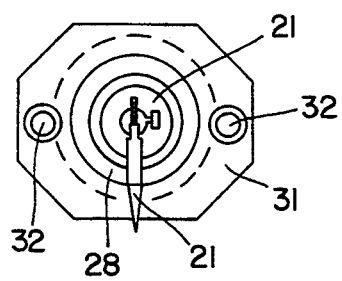
FIG. 4
FIG. 5
PRIOR ART
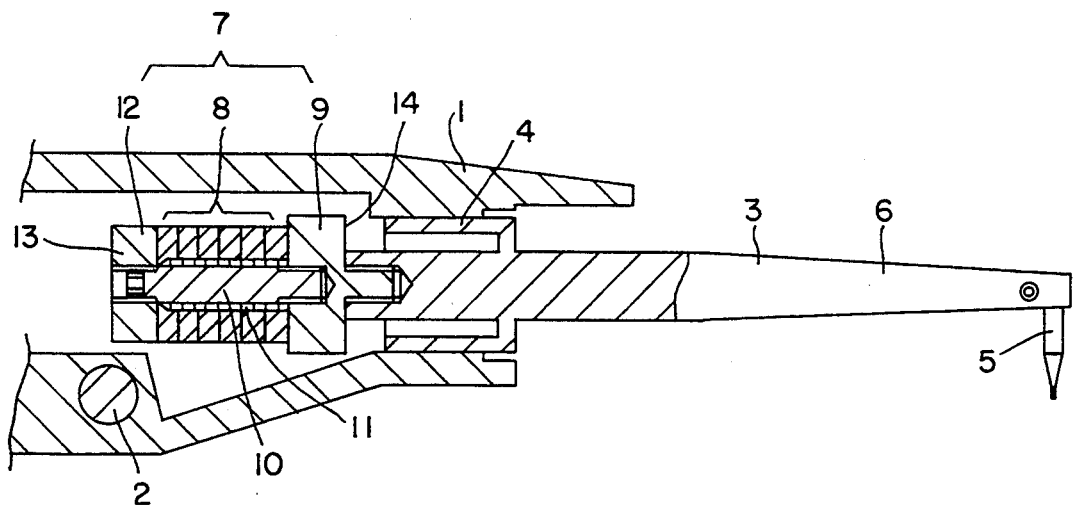

BONDING APPARATUS

BACKGROUND OF THE INVENTION

1. Field of the Invention

The present invention relates to a bonding apparatus and more particularly to a bonding apparatus provided with an ultrasonic bonding horn used in manufacturing of, for example, semiconductor devices.

2. Prior Art

One type of conventional bonding apparatus, a nailhead heat-and-pressure bonding type wire bonding apparatus, is shown in FIG. 5.

In this wire bonding apparatus, a supporting shaft 2 is fastened to a bonding arm 1 and is supported on a bonding head (not shown) either directly or via a lifter arm in a rotatable fashion. The horn support 4 of an ultrasonic horn 3 is mounted to the bonding arm 1. The ultrasonic horn 3 includes a horn body 6 which has a capillary 5 at one end and a vibrator 7 at another end. The vibrator 7 is screw-connected to the horn body 6. A bonding wire (not shown) passes through the capillary 5.

More specifically, the vibrator 7 includes a vibration-generating source 8 that is secured by screws. This screw installation is called a "Langevin" method. The vibrator 7 includes: a horn attachment 9 which is screw-connected to the horn body 6, a vibration-generating source attachment shaft 10 which has a threaded portion formed on both ends and is screw-connected to the horn attachment 9, an insulating pipe 11 which is fitted over the vibration-generating source attachment shaft 10, a vibration-generating source 8 which is obtained from a plurality of stacked doughnut-shaped electrostrictive strain elements or magnetostrictors that are fitted over the insulating pipe 11, and a nut 12 which is screw-connected to the vibration-generating source attachment shaft 10 so that the vibration-generating source 8 is tightened and secured between the nut 12 and the horn attachment 9.

In this conventional ultrasonic horn 3, the vibration-generating source 8 is located on the opposite side of the horn support 4 from the capillary 5. In other words, the vibration-generating source 8 is provided across from the capillary 5. The frequency of the vibrator 7 is adjusted to a desired level by the horn attachment 9 and the nut 12. The acoustic length of the vibrator 7 needs to be an integral multiple of ½ of the wavelength. Since there is no reason to use a lengthy vibrator, the vibrator 7 of the length equal to ½ of the wavelength is utilized. Furthermore, the free end 13 of the vibrator 7 acts as a vibrational antinode, and the horn attachment portion 14 of the horn attachment 9 acts as a vibrational antinode. Thus, the attachment of the vibrator 7 and the horn attachment 9 is facilitated.

In use, the vibration of the vibration-generating source 8 is transmitted throughout the entire ultrasonic horn 3 so that a standing-wave vibration is created in the ultrasonic horn 3, and the required energy is supplied to the capillary 5. In a non-loaded state (i.e., when bonding is not being performed), the energy accumulates in a stable manner. In addition, the horn 3 (particularly a skillfully crafted ultrasonic horn) is designed dimension-wise so that a node is formed in the horn support 4. Thus, the amount of movement of the horn support 4 is small and the loss of the movement is small even though the ultrasonic horn 3 is mounted to the bonding arm 1. In this non-loaded state, the ultrasonic horn 3 acts like a tuning fork, and the horn support 4 receives vibrations in a symmetrical manner from the left and right sides so that there is no movement to the left or right. The vibration-generating source 8 is ordinarily driven by constant-current driving, etc. so that the amplitude is kept at a prescribed value. When the energy is used for bonding via the capillary 5, the energy equilibrium between the vibration-generating source side and the capillary side loses its balance, and the node of vibration moves, and the energy required for equilibrium is fed in. An ultrasonic bonding is thus performed.

In the conventional ultrasonic horn 3, the vibration-generating source 8 is provided on the opposite side of the horn support 4 from the capillary 5. Accordingly, the energy of the vibration-generating source 8 passes through the horn support 4. Thus, when the vibration energy is consumed by bonding on the capillary side, the energy passing through the horn support 4 is subject to the influence of energy loss which fluctuates greatly according to the structure of the horn support 4, and the energy becomes unstable. The energy loss of the horn support 4 tends to fluctuate greatly when the amount of energy passing through the horn support 4 is large. Accordingly, it is difficult to ascertain the actual loaded conditions from the characteristics of the ultrasonic horn when it is in a non-loaded (or non-bonding) state.

The facts will be described below to a greater extent.

In the non-loaded state (or bonding is not being performed), energy from both sides of the horn support 4 causes distortion with the center of the horn support 4 forming a vibrational node; as a result, the horn support 4 does not move in the axial direction of the ultrasonic horn 3. The reason that the horn support 4 is selected to act as a supporting point is that a minimal energy loss is expected here because of a lack of minimal mechanical vibration. A well-crafted ultrasonic horn is stable in a non-loaded state and shows little loss. During the bonding operation, however, energy is consumed on the capillary side; as a result, the energy balance on both sides of the horn support 4 is destroyed, and vibration occurs in the horn support 4. Consequently, frictional movement occurs between the bonding arm 1 and the horn support 4, so that the relationship between the energy applied to the vibrator 7 and the energy used in the assembly of semiconductor devices is destroyed, lowering the bonding quality.

The energy consumed by the fixed parts of the horn support 4 and capillary 5 cannot be distinguished from the energy consumed in the actual bonding part. Accordingly, bonding under optimal conditions can only be accomplished by adjusting the current applied to the vibration-generating source 8 and the time of current application while examining the actual bonding results. However, the energy which is used needlessly for this purpose is unstable, and the energy used for bonding is also unstable.

In the conventional ultrasonic horn 3, when energy loss occurs during bonding so that the vibrational energy becomes insufficient on the capillary side of the horn support 4, the left-right equilibrium of the horn support 4 is destroyed, and the horn support 4, which is originally supposed to act as a vibrational node, cannot remain static and instead begins to move. As a result, the ultrasonic energy applied is converted into thermal energy between the horn support 4 and the bonding arm 1 or escapes into the bonding arm 1 and the parts attached to the bonding arm 1, thus causing the bonding arm 1, etc. to vibrate. All energy which is accumulated, consumed or released due to such unexpected causes leads to a deterioration in the bonding quality.

Another factor that causes deterioration of the bonding quality is variations in the frequency and impedance of the vibrator. The vibrator 7 shows a frequency variation of several hundred hertz between its minimal-amplitude and its maximum-amplitude. In the conventional structure, the vibration-generating source 8 is installed on one side of the horn support 4; accordingly, the frequency tends to be shifted on the two sides of the horn support 4. Even if there are two frequencies, vibration is actually performed at one frequency or the other. Accordingly, the amplitude of the capillary 5 varies greatly between cases where the vibration occurs at the frequency on the capillary side and cases where the vibration occurs at the frequency on the vibrator side. Furthermore, during actual bonding, the frequency may change suddenly according to fluctuations in the conditions, thus leading to defective bonding.

SUMMARY OF THE INVENTION

The object of the present invention is to provide a bonding apparatus having an ultrasonic horn that can provide an improved bonding stability.

The present invention is utilized in a heat-and-pressure bonding type wire bonding apparatus which uses nailhead ultrasonic waves, an ultrasonic wedge type wire bonding apparatus, a single tab bonding apparatus, and other types of bonding apparatuses that include an ultrasonic horn having a bonding tool and a vibration-generating source that is made of an electrostrictive strain element, a magnetostrictor, etc.

The object of the present invention is accomplished by a unique structure for a bonding apparatus in which an ultrasonic horn, that includes a bonding tool at its one end and vibration-generating sources, is mounted to a bonding arm, wherein the ultrasonic horn has the vibration-generating sources on both sides of a horn support that is used to attach the ultrasonic horn to the bonding arm, and the bonding apparatus further includes an ultrasonic oscillation device that operates the vibration-generating sources with separate outputs.

In the above and through out the following disclosure, the vibration-generating sources are, for example, an electrostrictive strain element and a magnetostrictor.

The object of the present invention is accomplished by another unique structure for a bonding apparatus in which an ultrasonic horn, that includes a bonding tool at its one end and vibration-generating sources, is mounted to a bonding arm, wherein the ultrasonic horn has the vibration-generating sources on both sides of a horn support that is used to attach the ultrasonic horn to the bonding arm, and the bonding apparatus further includes an ultrasonic oscillation device that operates the vibration-generating sources by detecting changes in the current or voltage of the vibration-generating source which is provided on the bonding tool side of the horn support.

In the above two structures of the present invention, the vibrational energy of the vibration-generating source provided on the bonding tool side of the horn support has no need to pass through the horn support. Accordingly, needless movement of the horn support that is derived from energy transfer to the bonding tool can be reduced. Furthermore, characteristic fluctuations of the vibration-generating sources affects the horn support less because with the vibration-generating sources both sides of the horn support can be nearly symmetrical to each other.

The ultrasonic oscillation device compares at least the current values of the vibration-generating source installed on the capillary side of the horn support. If the vibration on the capillary side should drop as the load is increased or as bonding progresses, the ultrasonic oscillation device performs a control function so that an ultrasonic oscillation power supply connected to the vibration-generating source on the capillary side is increased, thus preventing a further drop of the vibration on the capillary side.

BRIEF DESCRIPTION OF THE DRAWINGS

FIG. 3 is a cross section of essential portions of the ultrasonic horn of the bonding apparatus of the present invention;

FIG. 4 is a front view thereof; and

FIG. 5 is a cross section of essential portions of the ultrasonic horn of a conventional bonding apparatus.

DETAILED DESCRIPTION OF THE INVENTION

Figure 1:
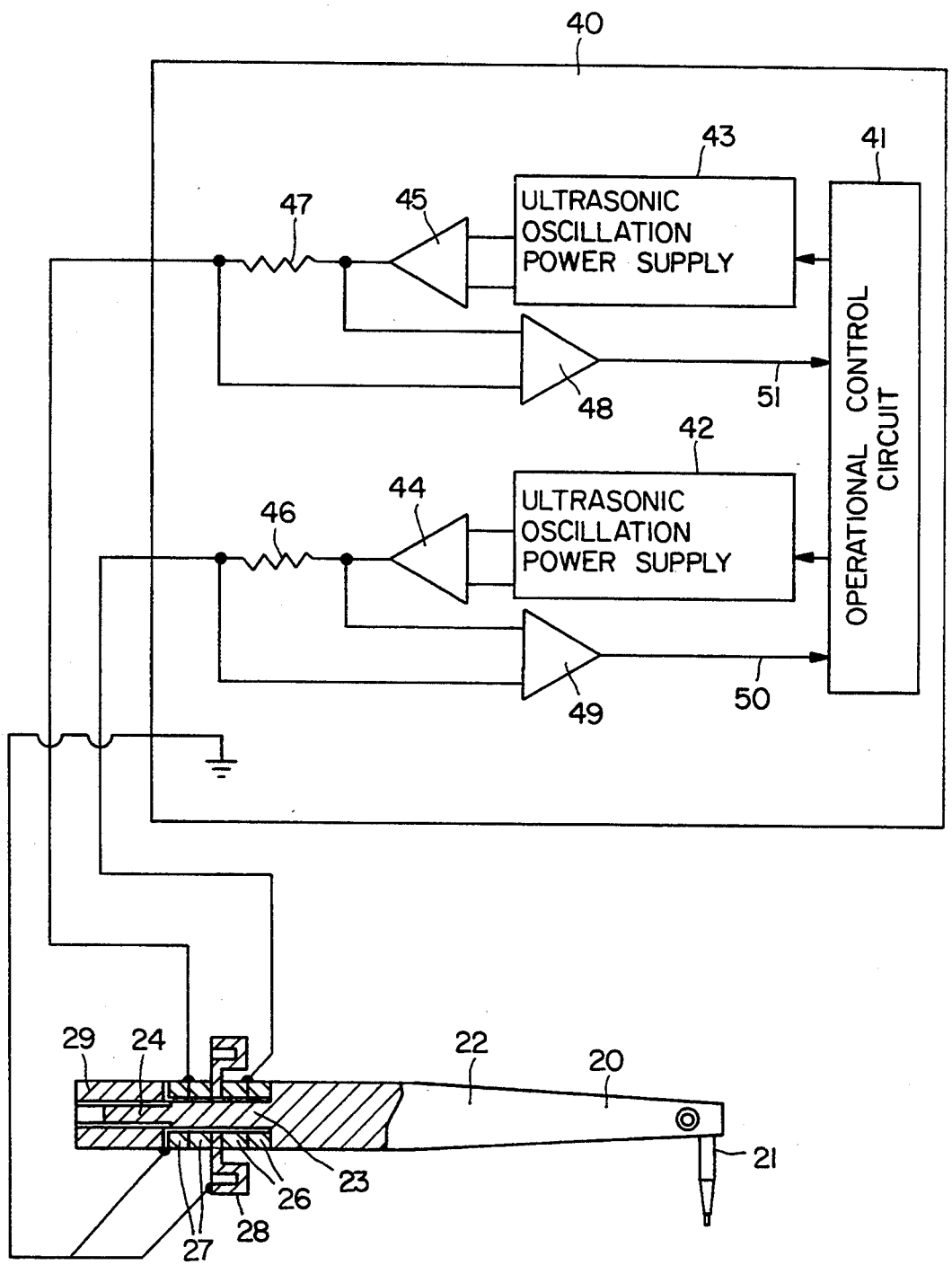
FIG. 1 shows a cross section of essential portions of an ultrasonic horn of the bonding apparatus of the present invention together with an ultrasonic oscillation device used for the horn.

The first embodiment of the present invention will be described with reference to FIGS. 1 and 2.

The ultrasonic horn 20 includes a horn body 22, which has a capillary 21 at one end. The horn body 22 has a vibration-generating source attachment shaft 23 on the other end, and a threaded portion 24 is extended from the end of the vibration-generating source attachment shaft 23. An insulating pipe 25 is fitted over the vibration-generating source attachment shaft 23.

Two vibration-generating sources 26 and 27 are fitted over the insulating pipe 25. Each one of the vibration-generating sources consists of a plurality of electrostrictive strain elements, magnetostrictors, etc. In this embodiment, two vibration-generating elements are used. In addition, a horn support 28 is installed over the insulating pipe 25 so that the horn support 28 is sandwiched by the vibration-generating sources 26 and 27. The vibration-generating sources 26 and 27 and the horn support 28 are all secured to the horn body 22 via a nut 29 screwed onto the threaded portion 24 of the horn body 22.

As seen from FIG. 3, the horn support 28 is held between a bonding arm 30 and a fastening plate 31. The fastening plate 31 is fastened to the bonding arm 30 by screws 32. The horn support 28 is thus mounted to the bonding arm 30.

In operation, since vibration-generating sources 26 and 27 are secured on both sides (right and left sides in the Figure) of the horn support 28, the vibrational energy from the vibration-generating source 26 that is positioned on the capillary 21 side of the horn support 28 has no need to pass through the horn support 28. Accordingly, needless movement of the horn support 28 caused by the transfer of energy to the capillary 21 can be reduced. Furthermore, since the both sides of the horn support 28 are almost symmetrical because of the vibration-generating sources provided on both sides of the horn support 28, fluctuations in the characteristics of the vibration-generating sources 26 and 27 do not greatly affect the horn support 28.

As described above, two vibration-generating sources 26 and 27 are employed in this embodiment. However, the number of the vibration-generating sources as well as the locations to install them should be altered depending upon the required output so that symmetrical fluctuations in the characteristic on both sides of the horn support 28 are obtained.

The vibration-generating sources 26 and 27 may be oscillated by a single oscillation power supply. However, the dimensions of the ultrasonic horn 20, particularly the dimensions of both (right and left in the drawing) sides of the horn support 28 cannot be precisely obtained. Thus, different resonance frequencies could occur on both sides of the horn support 28 if the vibration-generating sources 26 and 27 are oscillated by a single oscillation power supply. In this case, if the resonance frequency jumps due to changes in the load, etc. during bonding, the vibration of the capillary 21 will change greatly.

More specifically, if there is no load or before bonding, the Q value (an index which indicates favorable vibration) on the capillary 21 side of the horn support 28 (or the right-hand side of the horn support 28 in the drawing) becomes higher than the Q value on the other side of the horn support 28 (or the left-hand side of the horn support 28 in the drawing). However, when bonding starts or as bonding progresses, the Q value on the capillary 21 side decreases, and the vibration-generating sources 26 and 27 tend to vibrate independently from the vibration of the capillary 21. This phenomenon occurs in the conventional ultrasonic horn 3 also shown in FIG. 5. As a result, the vibrational amplitude of the capillary 21 becomes uncontrollable, causing defects in the semiconductor devices being bonded.

Such fluctuations in the resonance frequency on both sides of the horn support 28 can be avoided by separately controlling the vibration-generating sources 26 and 27 by an ultrasonic oscillation device 40 as shown in FIG. 1. In this embodiment, the vibration-generating sources 26 and 27 are of electrostrictive strain element.

As seen from FIG. 1, the ultrasonic oscillation device 40 includes two ultrasonic oscillation power supplies 42 and 43 which are controlled by control commands from an operational control circuit 41. The ultrasonic oscillation power supply 42 is connected to the vibration-generating source 26 via an amplifier 44 and a resistor 46. The ultrasonic oscillation power supply 43 is connected to the vibration-generating source 27 via an amplifier 45 and a resistor 47. The ultrasonic oscillation device 40 further includes amplifiers 48 and 49.

Accordingly, the oscillation outputs of ultrasonic oscillation power supplies 42 and 43 which are controlled by control commands from an operational control circuit 41 are amplified by amplifiers 44 and 45. As a result, constant voltages with a frequency of approximately 60 KHz are respectively applied to the vibration-generating sources 26 and 27, and the vibration-generating sources 26 and 27 give rise to a mechanical vibration so that the ultrasonic horn 20 is caused to vibrate. This causes the capillary 21 to vibrate.

As seen from the above, the vibration-generating sources 26 and 27 installed on both sides of the horn support 28 are driven separately.

The resistors 46 and 47 are installed in the wiring between the amplifiers 44 and 45 and the vibration-generating sources 26 and 27, respectively. The currents flowing through these resistors 46 and 47 are amplified by amplifiers 48 and 49, and the resulting current 50 and 51 are inputted into the operational control circuit 41.

The operational control circuit 41 compares the values of the current 50 and 51. If there is a drop in the current 50 (i.e., if there is a current drop in the Q value on the capillary 21 side) due to a load or the bonding, the operational control circuit 41 controls the ultrasonic oscillation power supply 42 so as to increase the oscillating output from the ultrasonic oscillation power supply 42. Thus, the Q value on the capillary 21 side is prevented from dropping, and defects in the semiconductor devices being bonded is prevented.

Figure 2:
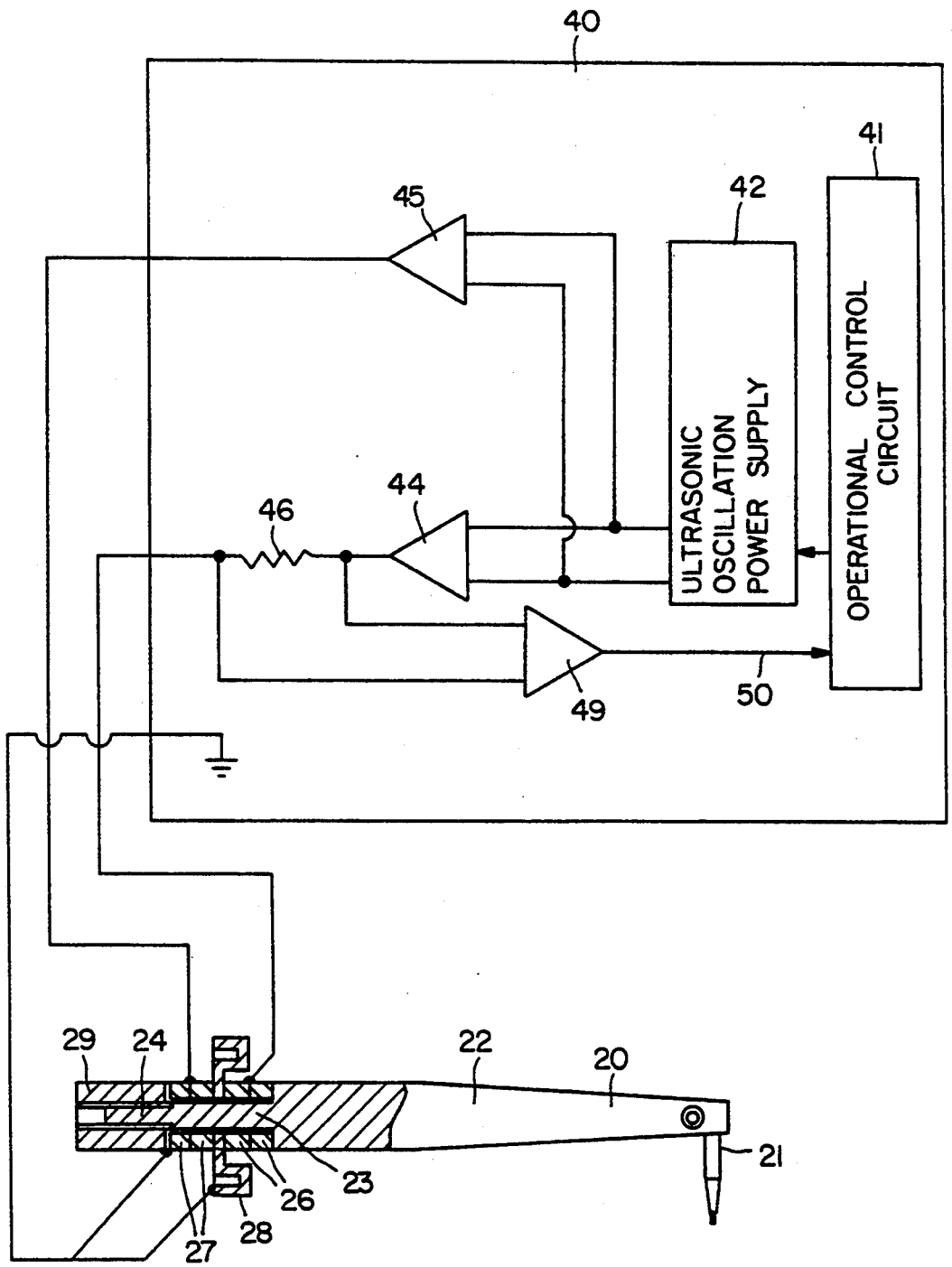
FIG. 2 shows a cross section of essential portions of another ultrasonic horn of the bonding apparatus of the present invention together with an ultrasonic oscillation device used for the horn.

FIG. 2 illustrates another embodiment of the present invention. Elements which are the same as or correspond to those in FIG. 1 are labeled with the same reference numerals.

In the embodiment of FIG. 1, control is accomplished by detecting fluctuations in the respective currents of the vibration-generating sources 26 and 27. However, as described above, the vibration of the capillary 21 fluctuates greatly when the resonance frequency on both sides of the horn support 28 jumps due to changes in the load during bonding and other reasons.

In the embodiment of FIG. 2, therefore, fluctuations only in the current 50 of the vibration-generating source 26 on the capillary 21 side of the horn support 28 are detected. In other words, in this second embodiment, ultrasonic vibration power supply 43, the resistor 47 and the amplifier 48 are not employed. Thus, only the output of the ultrasonic oscillation power supply 42 is controlled according to the fluctuations in the current 50, and the vibration-generating sources 26 and 27 are controlled at a frequency determined by the output of the ultrasonic oscillation power supply 42. An effect similar to that obtained in the embodiment of FIG. 1 above can be obtained using this type of control system as well.

In the ultrasonic oscillation devices 40 shown in FIGS. 1 and 2, the electrostrictive strain elements are used as the vibration-generating sources 26 and 27. However, the present invention can be applied to a system that uses a magnetostrictor for the vibration-generating sources 26 and 27. In this case, fluctuations in the voltages of the vibration-generating sources 26 and 27 are detected.

In each one of four embodiments described above, the present invention is applied to a nailhead ultrasonic wave/heat-and-pressure bonding type wire bonding apparatus, and therefore, the bonding tool used is the capillary 21 through which a bonding wire is passed. However, it goes without saying that the present invention is applicable to an ultrasonic wedge type wire bonding apparatus too, and in this case the bonding tool is a wedge with a wire passing through it. The present invention can be further applied to a single tab bonding apparatus that uses a tool which connects tab leads to semiconductor elements one at a time.

As seen from the above, according to the present invention, vibration-generating sources are provided on either side of a horn support of the ultrasonic horn, and at least the vibration-generating source that is provided on the bonding tool side is actuated. Accordingly, an improved bonding stability is secured.

We claim:

1. A bonding apparatus comprising an ultrasonic horn mounted to a bonding arm of said bonding apparatus, said ultrasonic horn being equipped with vibration-generating sources, and a bonding tool that is attached to one end of said ultrasonic horn, wherein said ultrasonic horn is further provided with a horn support, which is used to mount said ultrasonic horn to said bonding arm, so that said vibration-generating sources are located on both sides of said horn support, and an ultrasonic oscillation device that controls said vibration-generating sources via separate outputs.

2. A bonding apparatus according to claim 1, wherein said vibration-generating source is one selected from the group consisting of an electrostrictive strain element and a magnetostrictor.

3. A bonding apparatus comprising an ultrasonic horn mounted to a bonding arm of said bonding apparatus, said ultrasonic horn being equipped with vibration-generating sources, and a bonding tool that is attached at one end of said ultrasonic horn, wherein said ultrasonic horn is further provided with a horn support, which is used to mount said ultrasonic horn to said bonding arm, so that said vibration-generating sources are located on both sides of said horn support, and an ultrasonic oscillation device that detects an electric current or voltage of one of said vibration-generating sources provided on one side of said horn support so as to control said one of said vibration-generating sources.

4. A bonding apparatus according to claim 3, wherein said one of said vibration-generating sources provided on one side of said horn support is located on a side on which said bonding tool is provided.

5. A bonding apparatus according to claim 3, wherein said one of said vibration-generating sources is one selected from the group consisting of an electrostrictive strain element and a magnetostrictor.

6. A bonding apparatus comprising:
a bonding arm;
an ultrasonic horn mounted to said bonding arm via a horn support provided on said ultrasonic horn, said ultrasonic horn being provided with:
a bonding tool at one end of said ultrasonic horn;
vibration-generating sources located on both sides of said horn support; and
a fitting means for securely fitting said vibration-generating sources and said horn support on said ultrasonic horn by being screwed onto another end of said ultrasonic horn; and
an ultrasonic oscillation device electrically connected to said vibration-generating sources so as to independently operate said vibration-generating sources.

7. A bonding apparatus according to claim 6, wherein said ultrasonic oscillation device comprises an operation control circuit and ultrasonic oscillation power supplies electrically connected to said operation control circuit, said ultrasonic oscillation power supplies being electrically and respectively connected to said vibration-generating sources.

8. A bonding apparatus according to claim 6, wherein said ultrasonic oscillation device comprises an operation control circuit and an ultrasonic oscillation power supply electrically connected to said operation control circuit, said ultrasonic oscillation power supply being electrically connected to said vibration-generating sources.

* * * * *